United States Patent
Ramer et al.

(10) Patent No.: US 9,608,103 B2
(45) Date of Patent: Mar. 28, 2017

(54) HIGH ELECTRON MOBILITY TRANSISTOR WITH PERIODICALLY CARBON DOPED GALLIUM NITRIDE

(71) Applicant: Toshiba Corporation, Minato-ku, Tokyo (JP)

(72) Inventors: Jeffrey Craig Ramer, Fremont, CA (US); Karl Knieriem, Mayward, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/505,304

(22) Filed: Oct. 2, 2014

(65) Prior Publication Data

US 2016/0099345 A1    Apr. 7, 2016

(51) Int. Cl.
*H01L 29/205* (2006.01)
*H01L 29/778* (2006.01)
(Continued)

(52) U.S. Cl.
CPC ...... *H01L 29/7787* (2013.01); *H01L 21/0254* (2013.01); *H01L 21/02458* (2013.01);
(Continued)

(58) Field of Classification Search
CPC ............. H01L 21/0237; H01L 21/0254; H01L 21/0262; H01L 21/02458; H01L 21/02579;
(Continued)

(56) References Cited

U.S. PATENT DOCUMENTS

| 9,029,868 B2 | 5/2015 | Kotani et al. |
| 2008/0006845 A1 | 1/2008 | Derluyn et al. |

(Continued)

FOREIGN PATENT DOCUMENTS

| JP | 2008-171843 A | 7/2008 |
| JP | 2010-123725 A | 6/2010 |

(Continued)

OTHER PUBLICATIONS

Yasuhiro Isobe et al., "Semiconductor Device", U.S. Appl. No. 14/482,143, filed Sep. 10, 2014 (Specification 12 pages) and (Drawings 3 pages).

(Continued)

*Primary Examiner* — Benjamin Sandvik
*Assistant Examiner* — Fazli Erdem
(74) *Attorney, Agent, or Firm* — White & Case LLP

(57) ABSTRACT

A method for forming a high electron mobility transistor (HEMT) device with a plurality of alternating layers of one or more undoped gallium nitride (GaN) layers and one or more carbon doped gallium nitride layers (c-GaN), and an HEMT device formed by the method is disclosed. In one embodiment, the method includes forming a channel layer stack on a substrate, the channel layer stack having a plurality of alternating layers of one or more undoped gallium nitride (GaN) layers and one or more carbon doped gallium nitride layers (c-GaN). The method further includes forming a barrier layer on the channel layer stack. In one embodiment, the channel layer stack is formed by growing each of the one or more undoped gallium nitride (GaN) layers in growth conditions that suppress the incorporation of carbon in gallium nitride, and growing each of the one or more carbon doped gallium nitride (c-GaN) layers in growth conditions that promote the incorporation of carbon in gallium nitride.

29 Claims, 8 Drawing Sheets

(51) Int. Cl.
- *H01L 29/201* (2006.01)
- *H01L 29/10* (2006.01)
- *H01L 29/66* (2006.01)
- *H01L 21/02* (2006.01)
- *H01L 29/78* (2006.01)
- *H01L 29/20* (2006.01)
- *H01L 29/207* (2006.01)

(52) U.S. Cl.
CPC ...... *H01L 29/1029* (2013.01); *H01L 29/1075* (2013.01); *H01L 29/201* (2013.01); *H01L 29/205* (2013.01); *H01L 29/66* (2013.01); *H01L 29/66462* (2013.01); *H01L 29/7786* (2013.01); *H01L 29/78* (2013.01); *H01L 29/2003* (2013.01); *H01L 29/207* (2013.01)

(58) Field of Classification Search
CPC ............ H01L 29/7784; H01L 29/7786; H01L 29/66462; H01L 21/02381; H01L 21/02507; H01L 29/2003; H01L 29/155; H01L 29/205; H01L 29/78; H01L 29/7787; H01L 29/201; H01L 29/1029; H01L 29/66; H01L 29/1075

See application file for complete search history.

(56) References Cited

U.S. PATENT DOCUMENTS

| | | | |
|---|---|---|---|
| 2008/0099767 A1* | 5/2008 | Shakuda | H01L 29/0847 257/76 |
| 2009/0189190 A1* | 7/2009 | Hashimoto et al. | 257/194 |
| 2010/0219445 A1 | 9/2010 | Yokoyama et al. | |
| 2011/0062556 A1* | 3/2011 | Komiyama | H01L 21/02458 257/615 |
| 2011/0211607 A1 | 9/2011 | Takizawa et al. | |
| 2011/0240962 A1* | 10/2011 | Ikuta et al. | 257/15 |
| 2011/0241088 A1* | 10/2011 | Sato | H01L 29/0847 257/288 |
| 2011/0298009 A1 | 12/2011 | Ikuta et al. | |
| 2012/0211763 A1 | 8/2012 | Yoshida et al. | |
| 2012/0248577 A1* | 10/2012 | Romano et al. | 257/615 |
| 2012/0299060 A1* | 11/2012 | Kohda | H01L 21/02381 257/190 |
| 2013/0020581 A1* | 1/2013 | Teraguchi | H01L 21/02381 257/76 |
| 2013/0069076 A1* | 3/2013 | Iwami et al. | 257/76 |
| 2013/0099283 A1* | 4/2013 | Lin | H01L 29/267 257/190 |
| 2014/0015608 A1 | 1/2014 | Kotani et al. | |
| 2014/0021481 A1* | 1/2014 | Lee | H01L 29/2003 257/76 |
| 2014/0054647 A1 | 2/2014 | Chin et al. | |
| 2014/0175517 A1* | 6/2014 | Cheng | H01L 29/36 257/194 |
| 2014/0191193 A1* | 7/2014 | Choi et al. | 257/13 |
| 2014/0209920 A1* | 7/2014 | Liu et al. | 257/76 |
| 2014/0264370 A1* | 9/2014 | Keller et al. | 257/76 |
| 2014/0264455 A1* | 9/2014 | Keller et al. | 257/194 |
| 2014/0339598 A1* | 11/2014 | Park et al. | 257/101 |
| 2014/0339679 A1 | 11/2014 | Komiyama et al. | |
| 2014/0374771 A1 | 12/2014 | Umeno et al. | |
| 2015/0041825 A1* | 2/2015 | Liu et al. | 257/77 |
| 2015/0137179 A1* | 5/2015 | Yang | H01L 29/66462 257/190 |

FOREIGN PATENT DOCUMENTS

| | | |
|---|---|---|
| JP | 2014-072430 A | 4/2014 |
| WO | 2012/066701 A1 | 5/2012 |

OTHER PUBLICATIONS

Japanese Office Action issued on Apr. 20, 2016 in corresponding Japanese Application No. 2015-009070, along with English translation thereof.

Taiwanese Office Action issued on Dec. 23, 2016 in corresponding Taiwanese patent application No. 103142638, along with an English translation.

* cited by examiner

HIGH ELECTRON MOBILITY TRANSISTOR WITH PERIODICALLY CARBON DOPED GALLIUM NITRIDE

FIELD OF THE INVENTION

The invention relates generally to high electron mobility transistors, and particularly to high electron mobility transistors with periodically carbon doped gallium nitride (GaN) layers.

BACKGROUND OF THE INVENTION

The high electron mobility transistor (HEMT) is a type of field effect transistor (FET) in which a hetero-junction between a channel layer and a barrier layer whose electron affinity is smaller than that of the channel layer is formed. A two-dimensional electron gas (2DEG) forms in the channel layer of a group III-V HEMT device due to the mismatch in polarization field at the channel-barrier layer interface. The 2DEG has a high electron mobility that facilitates high-speed switching during device operation. In typical HEMT devices, a negatively-biased voltage may be applied to the gate electrode to deplete the 2DEG and thereby turn off the device. A group III-V HEMT device is one made of materials in column III of the periodic table, such as aluminum (Al), gallium (Ga), and indium (In), and materials in column V of the periodic table, such as nitrogen (N), phosphorus (P), and arsenic (As).

FIG. 1 shows a cross-sectional view of a prior art structure for an HEMT device. The HEMT device 100 shown in FIG. 1 begins with substrate 102, which can be silicon (Si), silicon carbide (SiC), sapphire ($Al_2O_3$), or any other suitable substrate for epitaxially growing layers of group III-V materials. For substrates other than bulk gallium nitride (GaN), it is difficult to epitaxially grow a high-quality gallium nitride (GaN) semiconductor crystal layer on substrate 102 due to poor lattice matching between the gallium nitride (GaN) and the substrate material. As such, an optional buffer layer 104, also known as a nucleation layer, can be deposited on substrate 102 to provide a surface on which high-quality gallium nitride (GaN) may be grown. Buffer layer 104 can be gallium nitride (GaN), aluminum gallium nitride (AlGaN), aluminum nitride (AlN), or any other suitable material for growing gallium nitride (GaN). Epitaxial growth of gallium nitride (GaN) forms a channel layer 106 on buffer layer 104. The channel layer 106 may be formed by any known process, including metal organic chemical vapor deposition (MOCVD), molecular beam epitaxy (MBE), or any other suitable growth technique.

Next, a barrier layer 108, also known as an electron supply layer, may be formed by epitaxial growth on channel layer 106. Barrier layer 108 may be made of aluminum gallium nitride ($Al_xGa_{1-x}N$), indium aluminum nitride ($In_xAl_{1-x}N$), or any other material suitable to form a hetero-junction with the gallium nitride (GaN) based channel layer 106. Electrodes 112 and 114 formed on barrier layer 108 act as the source and drain, respectively, of the HEMT device 100. Source and drain electrodes 112 and 114 may be titanium (Ti)/silicon (Si)/nickel (Ni), titanium (Ti)/aluminum (Al)/nickel (Ni), or any other suitable material that forms an ohmic contact with the barrier layer 108. Gate electrode 110 is also formed on barrier layer 108, between the source electrode 112 and drain electrode 114. Gate electrode 110 comprises a material that forms a non-ohmic contact (a contact which does not exhibit linear I-V characteristics) with the barrier layer 108.

During device operation of the foregoing HEMT device 100, a 2DEG forms on the channel layer side of the interface between channel layer 106 and barrier layer 108, allowing current to flow between the source electrode 112 and the drain electrode 114. A negative voltage (relative to substrate 102) may be applied to gate electrode 110 to deplete the 2DEG and shut off the flow of current between the source electrode 112 and the drain electrode 114, turning off the HEMT device 100.

To improve the electrical breakdown performance of the HEMT device 100, carbon (C) can be incorporated into the gallium nitride (GaN) based channel layer 106 to increase the electrical resistivity of the gallium nitride (GaN) material. While carbon (C) is naturally present in small concentrations in the gallium nitride (GaN) based channel layer 106, greater quantities of carbon (C) can be introduced in the gallium nitride (GaN) material (also known as carbon doped gallium nitride (c-GaN)) by altering the growth conditions of the gallium nitride (GaN) channel layer 106. Specifically, this infusion of carbon (C) can be achieved by growing the gallium nitride (GaN) channel layer 106 at low temperature, high growth rate, and a low ratio of group-V precursors to group-III precursors. However, the growth conditions that promote the incorporation of carbon (C) in gallium nitride (GaN) are in direct conflict with the growth conditions necessary to grow high-quality gallium nitride (GaN), which include high temperature, low growth rate, and a high ratio of group-V precursors to group-III precursors.

Because carbon doped gallium nitride (c-GaN) has inferior crystal quality and morphology, manufacturers are unable to grow the carbon doped gallium nitride (c-GaN) in thick layers, limiting the electrical breakdown performance of the HEMT device 100. The structural defects present in carbon-doped gallium nitride (c-GaN) may also result in poor device performance and lower yield per wafer due to structural deterioration of the carbon-doped gallium nitride (c-GaN) material. Moreover, a thick layer of carbon-doped gallium nitride (c-GaN) makes the HEMT device 100 unsuitable for an increasing number of end applications; particularly in light of the growing demand for smaller FET devices.

There is, therefore, an unmet demand for thinner HEMT devices with improved electrical breakdown performance and improved structural quality.

BRIEF DESCRIPTION OF THE INVENTION

In one embodiment, a method of forming a high electron mobility transistor (HEMT) device includes forming a channel layer stack on a substrate, the channel layer stack having a plurality of alternating layers of one or more undoped gallium nitride (GaN) layers and one or more carbon doped gallium nitride layers (c-GaN). The method further includes forming a barrier layer on the channel layer stack. In one embodiment, the barrier layer is aluminum gallium nitride ($Al_xGa_{1-x}N$).

In another embodiment, the method optionally includes forming a buffer layer between the substrate and the channel layer stack. In one embodiment, the method further includes forming source, drain, and gate electrodes on the barrier layer, with the gate electrode formed between the source and the drain electrodes. The source and the drain electrodes form an ohmic connection with the barrier layer, and the gate electrode forms a non-ohmic connection with the barrier layer.

In one embodiment, the channel layer stack is formed by growing each of the one or more undoped gallium nitride (GaN) layers in growth conditions that suppress the incorporation of carbon in gallium nitride, and growing each of the one or more carbon doped gallium nitride (c-GaN) layers in growth conditions that promote the incorporation of carbon in gallium nitride. In one embodiment, each of the one or more undoped gallium nitride (GaN) layers is grown with a carbon concentration of less than $5E^{18}$ Atoms/cm$^3$ and each of the one or more carbon doped gallium nitride (c-GaN) layers is grown with a carbon concentration of greater than $5E^{18}$ Atoms/cm$^3$.

In one embodiment, each of the one or more undoped gallium nitride (GaN) layers is grown at a low growth rate and with a high ratio of group-V precursors to group-III precursors, and each of the one or more carbon doped gallium nitride (c-GaN) layers is grown at a high growth rate and with a low ratio of group-V precursors to group-III precursors. In one embodiment, each one of the one or more undoped gallium nitride (GaN) layers is grown at a rate greater than 0.1 µm/hr and less than 5 µm/hr, and each one of the one or more carbon doped gallium nitride (c-GaN) layers is grown at a rate greater than 5 µm/hr and less than 10 µm/hr. In one embodiment, each of the one or more carbon doped gallium nitride (c-GaN) layers is grown at a rate about fifteen to twenty times greater than each of the one or more undoped gallium nitride (GaN) layers.

In one embodiment, each of the one or more undoped gallium nitride (GaN) layers is grown using a ratio of group-V precursors to group-III precursors that is greater than 100:1 and less than 10000:1, and each of the one or more carbon doped gallium nitride (c-GaN) layers is grown using a ratio of group-V precursors to group-III precursors that is greater than 10:1 and less than 200:1. In one embodiment, the one or more undoped gallium nitride (GaN) layers and the one or more carbon doped gallium nitride (c-GaN) layers are grown at a temperature greater than 750 C and less than 1000 C, and at a pressure greater than 35 Torr and less than 700 Torr.

In one embodiment, each of the one or more undoped gallium nitride (GaN) layers is grown to a thickness greater than 1 nm and less than 200 nm, and each of the one or more carbon doped gallium nitride (c-GaN) layers is grown to a thickness greater than 1 nm and less than 500 nm. In one embodiment, the ratio of the thickness of each of the one or more carbon doped gallium nitride (c-GaN) layers to the thickness of the each of the one or more undoped gallium nitride (GaN) layers is greater than 1:3 and less than 3:1.

In one embodiment, a high electron mobility transistor (HEMT) device includes a substrate and a channel layer stack having a plurality of alternating layers of one or more undoped gallium nitride (GaN) layers and one or more carbon doped gallium nitride (c-GaN) layers formed on the substrate. The HEMT device further includes a barrier layer formed on the channel layer stack. In one embodiment, the barrier layer is aluminum gallium nitride (Al$_x$Ga$_{1-x}$N). In another embodiment, the HEMT device optionally includes a buffer layer formed between the substrate and the channel layer stack. In one embodiment, the HEMT device further includes source, drain, and gate electrodes formed on the barrier layer, with the gate electrode formed between the source and the drain electrodes. The source and drain electrodes form an ohmic connection with the barrier layer, and the gate electrode forms a non-ohmic connection with the barrier layer.

In one embodiment, each of the one or more undoped gallium nitride (GaN) layers have a carbon concentration of less than $1E^{18}$ Atoms/cm$^3$ and each of the one or more carbon doped gallium nitride (c-GaN) layers have a carbon concentration of greater than $1E^{18}$ Atoms/cm$^3$. In one embodiment, each of the one or more undoped gallium nitride (GaN) layers is greater than 1 nm and less than 200 nm thick, and each of the one or more carbon doped gallium nitride (c-GaN) layers is greater than 1 nm and less than 500 nm thick. In one embodiment, the ratio of the thickness of each of the one or more carbon doped gallium nitride (c-GaN) layers to the thickness of the each of the one or more undoped gallium nitride (GaN) layers is greater than 1:3 and less than 3:1.

DETAILED DESCRIPTION OF THE INVENTION

Figure 2A:
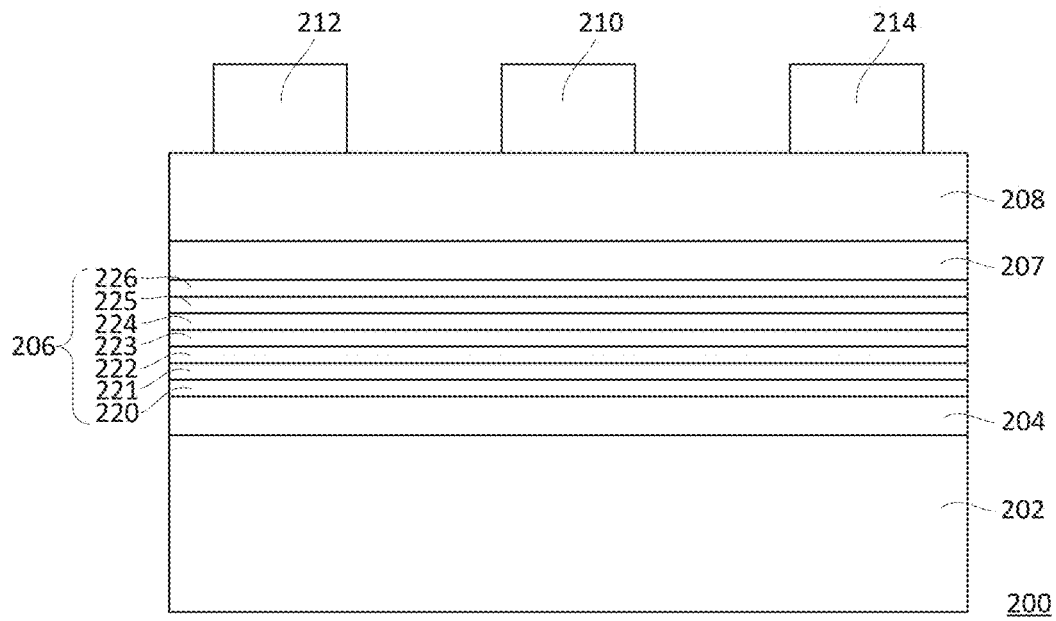
FIG. 2A shows a cross-sectional view of an HEMT device with alternating layers of undoped gallium nitride and carbon doped gallium nitride, according to one embodiment of the invention.

FIG. 2A shows a cross-sectional view of an HEMT device with alternating layers of undoped gallium nitride and carbon-doped gallium nitride, according to one embodiment of the invention. In FIG. 2, HEMT device 200 begins with substrate 202. Substrate 202 can be silicon (Si), silicon carbide (SiC), sapphire (Al$_2$O$_3$), bulk gallium nitride (GaN), or any other suitable substrate for epitaxially growing layers of gallium nitride (GaN). In one embodiment, not shown, the substrate 202 is bulk gallium nitride (GaN), and a plurality of alternating layers of undoped gallium nitride (GaN) and carbon doped gallium nitride (GaN) are epitaxially grown directly on top of the substrate 202.

In another embodiment, the substrate 202 is any suitable material for growing layers of gallium nitride (GaN), other than bulk gallium nitride (GaN). In this embodiment, a buffer layer 204 is deposited on top of substrate 202. Buffer layer 204 can be gallium nitride (GaN), aluminum gallium nitride (AlGaN), aluminum nitride (AlN), or any other suitable material for growing gallium nitride (GaN).

A channel layer stack 206 is then formed on top of the barrier layer 204. In another embodiment, the channel layer stack 206 is formed by growing a single layer of carbon doped gallium nitride (c-GaN) and growing a single layer of undoped gallium nitride (GaN). In yet another embodiment, the channel layer stack 206 is formed by growing a plurality of alternating layers of one or more carbon doped gallium nitride (c-GaN) layers and one or more undoped gallium nitride (GaN) layers.

In general, there will be a trade-off between the number of alternating layers of carbon doped gallium nitride (c-GaN) and undoped gallium nitride (GaN), and the electrical performance of the HEMT device 200. As previously discussed, growing thick layers of carbon-doped gallium nitride (c-GaN) may result in poor device performance and increased likelihood of device failure due to the inferior crystal morphology and structural quality of carbon-doped gallium nitride (c-GaN). As such, an HEMT device with a channel layer stack 206 with a single layer of carbon doped gallium nitride (c-GaN) and a single layer of undoped gallium nitride (GaN) will be thinner than an HEMT device with multiple alternating layers of carbon doped gallium nitride (c-GaN) and undoped gallium nitride (GaN), but will also have reduced electrical performance due to the reduced amount of carbon-doped gallium nitride (c-GaN) in the channel layer stack 206.

In one embodiment, the channel layer stack 206 is formed by epitaxially growing alternating layers of undoped gallium nitride (GaN) 221, 223, and 225, and layers of carbon doped gallium nitride (c-GaN) 220, 222, 224, and 226. The alternating layers of undoped gallium nitride (GaN) 221, 223, and 225, and layers of carbon doped gallium nitride (c-GaN) 220, 222, 224, and 226 may be grown by any known process, including metal organic chemical vapor deposition (MOCVD), molecular beam epitaxy (MBE), or any other suitable growth technique.

In one embodiment, the undoped gallium nitride layers 221, 223, and 225 have a carbon concentration less than $1E^{18}$ Atoms/cm$^3$ and the carbon doped gallium nitride layers 220, 222, 224, and 226 have a carbon concentration greater than $1E^{18}$ Atoms/cm$^3$. In one embodiment, each of the undoped gallium nitride (GaN) layers 221, 223, and 225 have a thickness greater than 1 nm and less than 200 nm, and each of the carbon doped gallium nitride (c-GaN) layers 220, 222, 224, and 226 have a thickness greater than 1 nm and less than 500 nm. In one embodiment, the ratio of the thickness of each of the undoped gallium nitride (GaN) layers 221, 223, and 225 to the thickness of each of the carbon doped gallium nitride (c-GaN) layers 220, 222, 224, and 226 is greater than 1:3 and less than 3:1.

In one embodiment, an optional additional layer of undoped gallium nitride (GaN) 207 is formed on top of the channel layer stack 206. Undoped gallium nitride (GaN) layer 207 provides a high-quality surface on top of which a barrier layer 208 is formed. The thickness of undoped gallium nitride (GaN) layer 207 will vary depending on the overall thickness of the channel layer stack 206 and the alternating layers of carbon doped gallium nitride (c-GaN) 220, 222, 224, and 226 and undoped gallium nitride (GaN) 221, 223, and 225, but should be large enough to compensate for the inferior crystal quality and morphology of the underlying carbon doped gallium nitride (c-GaN) layers 220, 222, 224, and 226. In one embodiment, the thickness of undoped gallium nitride (GaN) layer is between 20 nm and 3 μm.

Figure 2B:
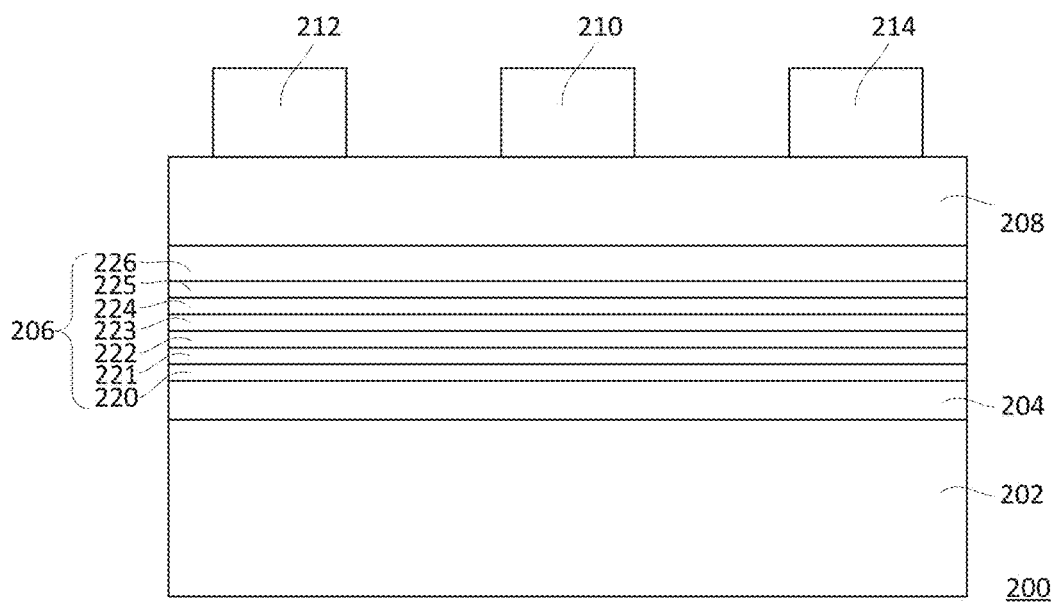
FIG. 2B shows a cross-sectional view of an HEMT device with alternating layers of undoped gallium nitride and carbon doped gallium nitride, according to another embodiment of the invention.

In another embodiment, shown in FIG. 2B, the uppermost layer of the channel layer stack 206 is an undoped gallium nitride (GaN) layer 226 and the barrier layer 208 is formed directly on top of the channel layer stack 206. In this embodiment, undoped gallium nitride (GaN) layer 226 should also be thick enough to compensate for the inferior crystal quality and morphology of the underlying carbon doped gallium nitride (c-GaN) layers 220, 222, and 224. In one embodiment, the thickness of undoped gallium nitride (GaN) layer 226 is between 20 nm and 3 μm. In both FIGS. 2A-B, the barrier layer 208 can be aluminum gallium nitride ($Al_xGa_{1-x}N$), indium aluminum nitride ($In_xAl_{1-x}N$), or any other material suitable to form a hetero-junction with the gallium nitride (GaN) based channel layer stack 206.

Source electrode 212 and drain electrode 214 are then formed on top of the barrier layer 208 and electrically coupled to the barrier layer 208. A gate electrode 210 is formed between the source electrode 212 and the drain electrode 214. The gate electrode is also electrically coupled to the barrier layer 208. Source electrode 212 and drain electrode 214 form an ohmic contact with the barrier layer 208, and the gate electrode 210 forms a non-ohmic contact (a contact which does not exhibit linear I-V characteristics) with the barrier layer 208.

Figure 1:
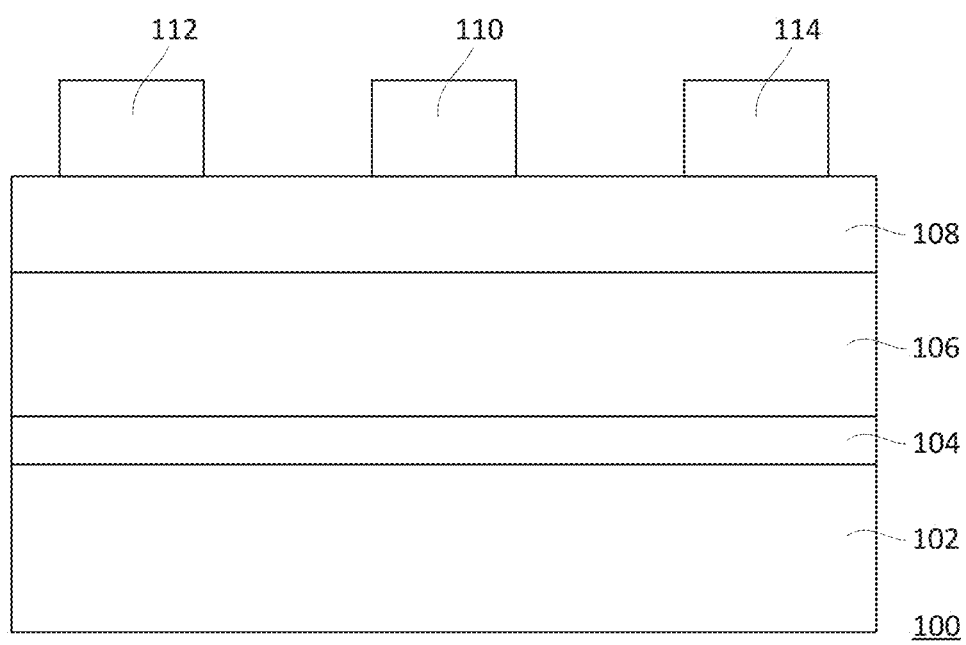
FIG. 1 shows a cross-sectional view of a prior art structure for an HEMT device.

During device operation of the HEMT device 200, a 2DEG forms on the channel stack layer side of the interface between channel stack layer 206 or the optional undoped gallium nitride (GaN) layer 207 and barrier layer 208, allowing current to flow between the source electrode 212 and the drain electrode 214. By forming a channel layer stack 206 comprising alternating layers of undoped gallium nitride (GaN) 221, 223, and 225, and layers of carbon doped gallium nitride (c-GaN) 220, 222, 224, and 226, the WASHINGTON 2380530 (2K) HEMT device 200 has improved electrical breakdown performance without the inferior structure quality of the HEMT device 100 with a thick carbon doped gallium nitride (c-GaN) channel layer 106, as described in FIG. 1.

By forming alternating layers of undoped gallium nitride (GaN) and carbon doped gallium nitride (c-GaN), the inferior crystal quality and morphology of the carbon doped gallium nitride (c-GaN) layers are, in essence, repaired by the high-quality undoped gallium nitride (GaN) layers, avoiding the undesirable structural degradation associated with a single layer of carbon doped gallium nitride (c-GaN) while simultaneously maintaining the desirable resistivity characteristics of carbon doped gallium nitride (c-GaN). Because the layers of undoped gallium nitride (GaN) compensate for the inferior crystal quality and morphology of the carbon doped gallium nitride (c-GaN) layers, the overall thickness of the HEMT device 200 can be made thinner than the prior art HEMT device 100, shown in FIG. 1, allowing the HEMT device 200 to be used in increasingly smaller electronics devices, for example, smaller AC-DC power convertors used to provide power to laptops and other mobile electronic devices. The alternating layers of high quality undoped gallium nitride (GaN) allow for the use of more carbon doped gallium nitride (c-GaN) in the channel layer stack, which as previously explained would otherwise cause unacceptable deterioration if a single thick layer of carbon doped gallium nitride (c-GaN) were used, so the performance of the HEMT device 200 can be improved without making the overall HEMT device 200 thicker. Further, the improved structural quality of the HEMT device 200 will also result in improved yield, and as a result, lower overall cost of manufacturing per device compared to the prior art HEMT device 100.

Figure 3A:
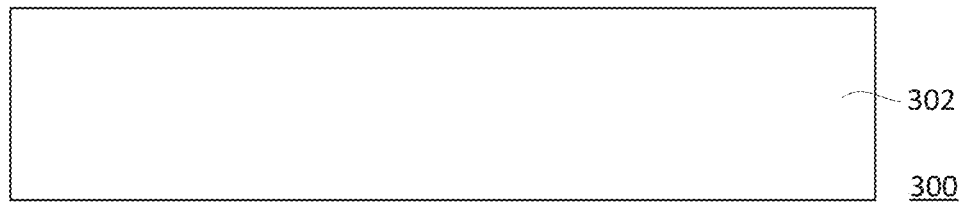
FIGS. 3A-H shows cross-sectional views of the manufacturing steps for producing an HEMT device with alternating layers of undoped gallium nitride and carbon-doped gallium nitride, according to one embodiment of the invention.
Figure 3B:
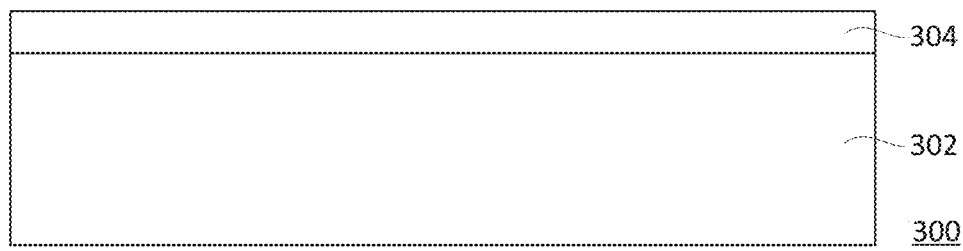

FIGS. 3A-H shows cross-sectional views of the manufacturing steps for producing an HEMT device with alternating layers of undoped gallium nitride (GaN) and carbon-doped gallium nitride (c-GaN), according to one embodiment of the invention. In FIG. 3A, the formation of HEMT device 300 begins by providing a substrate 302. Substrate 302 can be silicon (Si), silicon carbide (SiC), sapphire ($Al_2O_3$), or any other suitable substrate for epitaxially growing layers of gallium nitride (GaN). In FIG. 3B, a buffer layer 304 is deposited on top of substrate 302. Buffer layer 304 can be gallium nitride (GaN), aluminum gallium nitride (AlGaN), aluminum nitride (AlN), or any other suitable material for growing gallium nitride (GaN). In one embodiment, the substrate 302 is bulk gallium nitride (GaN), in which case the manufacturing step shown in FIG. 3B of forming the buffer layer 304 is optional.

Figure 3C:
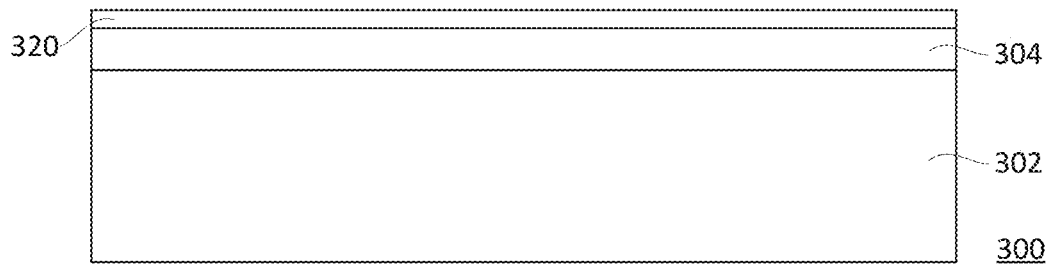
Figure 3D:
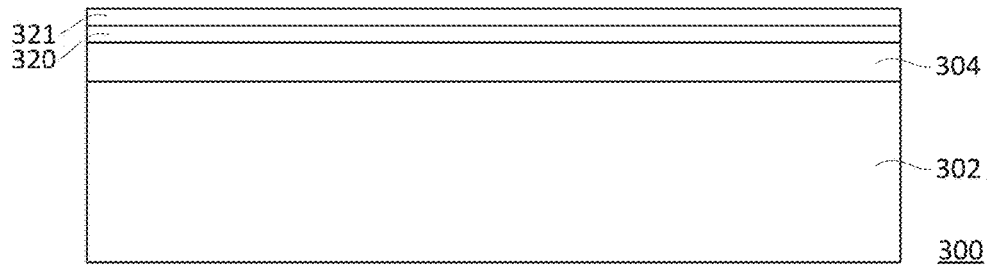

In FIG. 3C, a layer of carbon doped gallium nitride (c-GaN) 320 is epitaxially grown on the buffer layer 304, or substrate 302 if buffer layer 304 is not formed as described above. The carbon doped gallium nitride (c-GaN) layer 320 is grown by any known process, including metal organic chemical vapor deposition (MOCVD), molecular beam epitaxy (MBE), or any other suitable growth technique, and in growth conditions that promote the incorporation of carbon (C) in the gallium nitride (GaN) material. The growth conditions that promote the incorporation of carbon (C) in the gallium nitride (GaN) material include low temperature, high growth rate, and a low ratio of group-V precursors to group-III precursors. In FIG. 3D, a layer of undoped gallium nitride (GaN) 321 is epitaxially grown on the carbon doped gallium nitride (c-GaN) layer 320. The undoped gallium nitride (GaN) layer 321 is grown in growth conditions that suppress the incorporation of carbon (C) in the gallium nitride (GaN) material. The growth conditions that suppress the incorporation of carbon (C) in the gallium nitride (GaN) material include high temperature, low growth rate, and a high ratio of group-V precursors to group-III precursors.

Figure 3E:
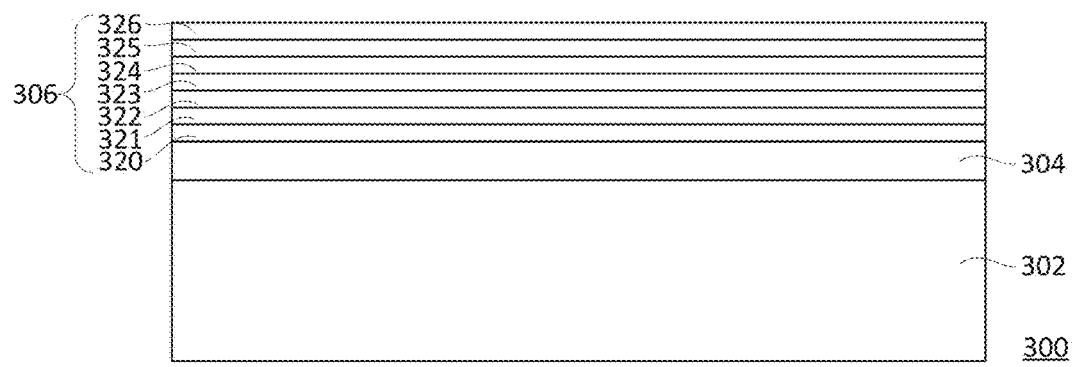

In FIG. 3E, like the carbon doped gallium nitride (c-GaN) layer 320 and the undoped gallium nitride (GaN) layer 321, alternating layers of carbon doped gallium nitride (c-GaN) 322, 324, and 326 and layers of undoped gallium nitride (GaN) 323 and 325 are grown in growth conditions that promote the incorporation of carbon (C) in the gallium nitride material and in growth conditions that suppress the incorporation of carbon (C) in the gallium nitride material, respectively, on top of the undoped gallium nitride (GaN) layer 321 to form a channel layer stack 306. In one embodiment, the carbon doped gallium nitride (c-Gan) layers 320, 322, 324, and 326 are grown with a carbon concentration of greater than $1E^{18}$ Atoms/$cm^3$, and the undoped gallium nitride (GaN) layers 321, 323, and 325 are grown with a carbon concentration of less than $1E^{18}$ Atoms/$cm^3$.

In one embodiment, the alternating layers of carbon doped gallium nitride (c-GaN) 320, 322, 324, and 326, and layers of undoped gallium nitride (GaN) are grown at a constant temperature and a constant pressure. The temperature may be greater than 750 C and less than 1000 C, and the pressure may be greater than 35 Torr and less than 700 Torr. In one embodiment, while maintaining the temperature and pressure, the growth rate is oscillated between a high growth to grow the carbon doped gallium nitride (c-GaN) layers 320, 322, 324, and 326, and a low growth rate to grow the undoped gallium nitride (GaN) layers 321, 323, and 325.

In another embodiment, rather than oscillating the growth rate, the ratio of group-V precursors to group-III precursors is oscillated between a low ratio of group-V precursors to group-III precursors to grow the carbon doped gallium nitride (c-GaN) layers 320, 322, 324, and 326, and a high ratio of group-V precursors to group-III precursors to grow the undoped gallium nitride (GaN) layers 321, 323, and 325. In yet another embodiment, both the growth rate and the ratio of group-V precursors to group-III precursors are oscillated between a high growth rate and a low ratio of group-V precursors to group-III precursors to grow the carbon doped gallium nitride (c-GaN) layers 320, 322, 324, and 326, and a low growth rate and a high ratio of group-V precursors to group-III precursors to grow the undoped gallium nitride (GaN) layers 321, 323, and 325.

The high growth rate for growing the carbon doped gallium nitride (c-GaN) layers 320, 322, 324, and 326 is greater than 5 μm/hr and less than 10 μm/hr, and the low ratio of group-V precursors to group-III precursors is greater than 10:1 and less than 200:1. The low growth rate for growing the undoped gallium nitride (GaN) layers 321, 323, and 325 is greater than 0.1 μm/hr and less than 5 μm/hr, and the high ratio of group-V precursors to group-III precursors is greater than 100:1 and less than 10000:1. In one embodiment, the high growth rate for growing the carbon doped gallium nitride (c-GaN) layers 320, 322, 324, and 326 is about fifteen to twenty times the low growth rate for growing the undoped gallium nitride (GaN) layers 321, 323, and 325.

In one embodiment, each of the undoped gallium nitride (GaN) layers 321, 323, and 325 is grown to a thickness greater than 1 nm and less than 200 nm, and each of the carbon doped gallium nitride (c-GaN) layers 320, 322, 324, and 326 is grown to a thickness greater than 1 nm and less than 500 nm. In one embodiment, the ratio of the thickness of each of the undoped gallium nitride (GaN) layers 321, 323, and 325 to the thickness of each of the carbon doped gallium nitride (c-GaN) layers 320, 322, 324, and 326 is greater than 1:3 and less than 3:1.

In another embodiment, the channel layer stack 306 is formed by growing a single layer of carbon doped gallium nitride (c-GaN) and growing a single layer of undoped gallium nitride (GaN). In yet another embodiment, the channel layer stack 306 is formed by growing a plurality of alternating layers of one or more carbon doped gallium nitride (c-GaN) layers and one or more undoped gallium nitride (GaN) layers.

Figure 3F:
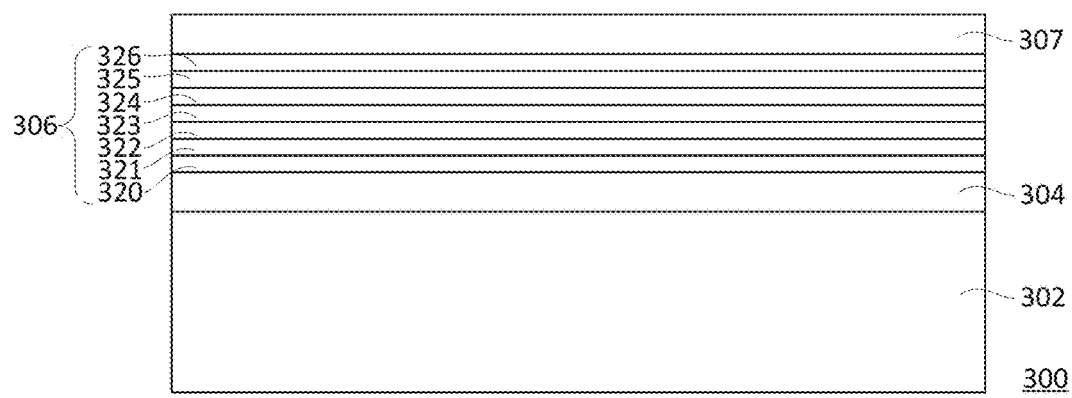

In FIG. 3F, another layer of undoped gallium nitride (GaN) 307 is epitaxially grown on top of the uppermost carbon doped gallium nitride (c-GaN) layer 326 of channel layer stack 306. The undoped gallium nitride (GaN) layer 307 may be grown under the same conditions as undoped gallium nitride (GaN) layers 321, 323, and 325, or any other growth conditions that suppress the incorporation of carbon (C) in the gallium nitride (GaN) material. The undoped gallium nitride (GaN) layer 307 also has a carbon concentration of less than $1E^{18}$ Atoms/$cm^3$ and a thickness between 20 nm and 3 μm.

In another embodiment, not shown, the upper most layer of the channel layer stack 306 is an undoped gallium nitride (GaN) layer. In this embodiment, the manufacturing step shown in FIG. 3F is unnecessary, and the additional layer of undoped gallium nitride (GaN) 307 is not deposited on top of the channel layer stack 306.

Figure 3G:
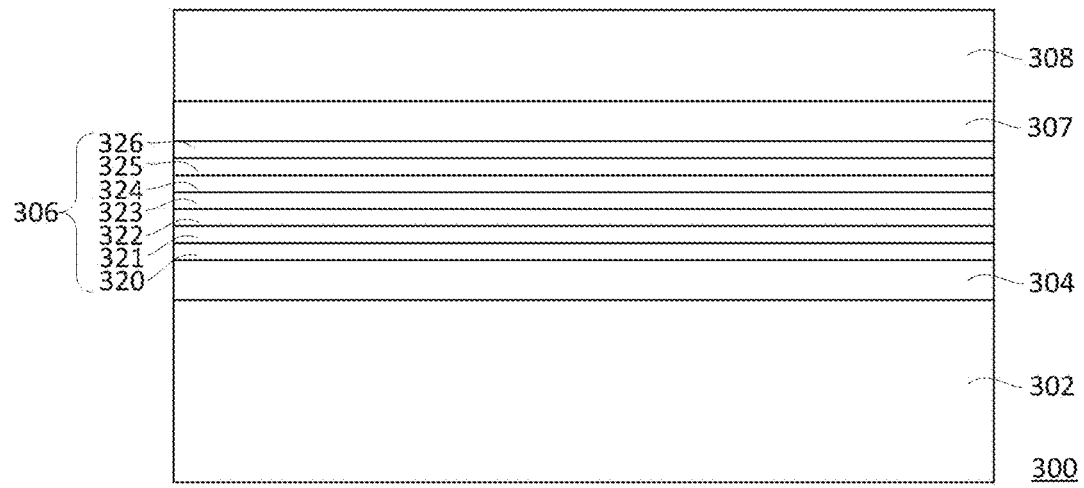

In FIG. 3G, a barrier layer 308 is formed on top of the undoped gallium nitride (GaN) layer 307, or the channel layer stack 306 as described above. The barrier layer 308 may be formed by MOCVD, MBE, or any other suitable deposition process. The barrier layer 308 can be aluminum gallium nitride ($Al_xGa_{1-x}N$), indium aluminum nitride ($In_xAl_{1-x}N$), or any other material suitable to form a heterojunction with the gallium nitride (GaN) based channel layer stack 306.

Figure 3H:
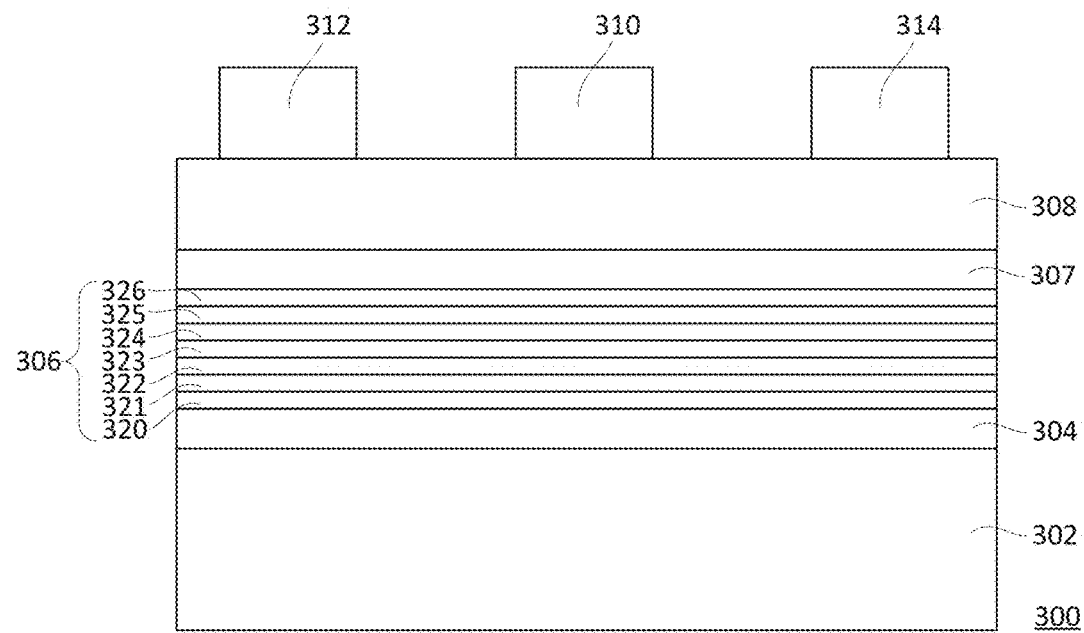

In FIG. 3H, using known deposition, photolithography, and etching processes, source electrode 312 and drain electrode 314 are formed on top of the barrier layer 308 and electrically coupled to the barrier layer 308. A gate electrode 310 is formed between the source electrode 312 and the drain electrode 314. The gate electrode is also electrically coupled to the barrier layer 308. Source electrode 312 and drain electrode 314 form an ohmic contact with the barrier layer 308, and the gate electrode 310 forms a non-ohmic contact (a contact which does not exhibit linear I-V characteristics) with the barrier layer 308.

Similar to the HEMT device 200 shown in FIG. 2, the HEMT device 300 manufactured by the process described in FIGS. 3A-H will have improved electrical breakdown performance without sacrificing structural quality by forming a channel layer stack 306 comprising growing alternating layers of undoped gallium nitride (GaN) 321, 323, and 325, and layers of carbon doped gallium nitride (c-GaN) 320, 322, 324, and 326. The improved structural quality of the HEMT device 300 will also improve yield and, consequently, lower the overall manufacturing cost. Additionally, the HEMT device 300 can be made thinner than prior art devices as the alternating layers of undoped gallium nitride (GaN) 321, 323, and 325 and layers of carbon doped gallium nitride (c-GaN) 320, 322, 324, and 326 that comprise the channel layer stack 306 can be grown relatively thinly, in some embodiments as thin as a few nm per layer, as compared to the prior art HEMT device 100 shown in FIG. 1 which typically requires the carbon-doped gallium nitride (c-GaN) channel layer 106 be several μm thick.

Figure 4:
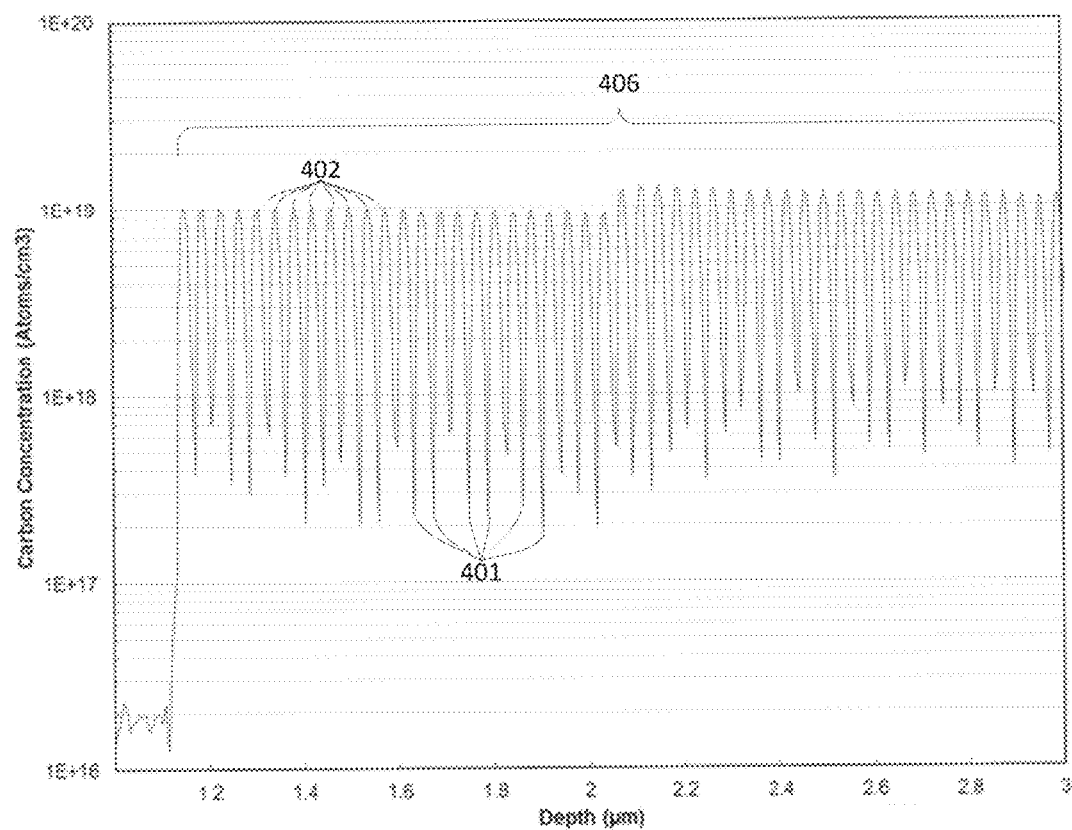
FIG. 4 shows a plot of the carbon concentration of an HEMT device with alternating layers of undoped gallium nitride and carbon doped gallium nitride, according to one embodiment of the invention.

FIG. 4 shows a plot of the carbon concentration of an HEMT device with alternating layers of undoped gallium nitride (GaN) and carbon doped gallium nitride (c-GaN), according to one embodiment of the invention. The plot in FIG. 4 is generated by a Secondary Ion Mass Spectroscopy (SIMS) analysis of the alternating layers of undoped gallium nitride (GaN) and carbon doped gallium nitride (c-GaN) that comprise the channel layer stack 406 of the HMET device, according to one embodiment of the invention. As shown in FIG. 4, the carbon doped gallium nitride (c-GaN) layers 402 are represented by the peaks of the SIMS plot, with an approximate carbon concentration of $1E^{19}$ Atoms/cm$^3$, and the undoped gallium nitride (GaN) layers 401 are represented by the valleys of the SIMS plot, with an approximate carbon concentration of $1E^{18}$ Atoms/cm$^3$. FIG. 4 also shows that the thickness of the alternating layers of carbon doped gallium nitride (c-GaN) layers 402 and undoped gallium nitride (GaN) layers 401 are approximately 30 nm-50 nm. While the total thickness of the channel layer stack 406 of the HEMT device shown in FIG. 4 is approximately 1.8 μm, in other embodiments, channel layer stack 406 can be substantially thinner, with fewer alternating layers of carbon doped gallium nitride (c-GaN) and undoped gallium nitride (GaN), or thinner individual layers of carbon doped gallium nitride (c-GaN) and undoped gallium nitride (GaN), or both. As previously discussed, in some embodiments, the thickness of each layer of carbon doped gallium nitride (c-GaN) can be greater than 1 nm and less than 500 nm, and the thickness of each layer of undoped gallium nitride (GaN) can be greater than 1 nm and less than 200 nm.

Figure 5:
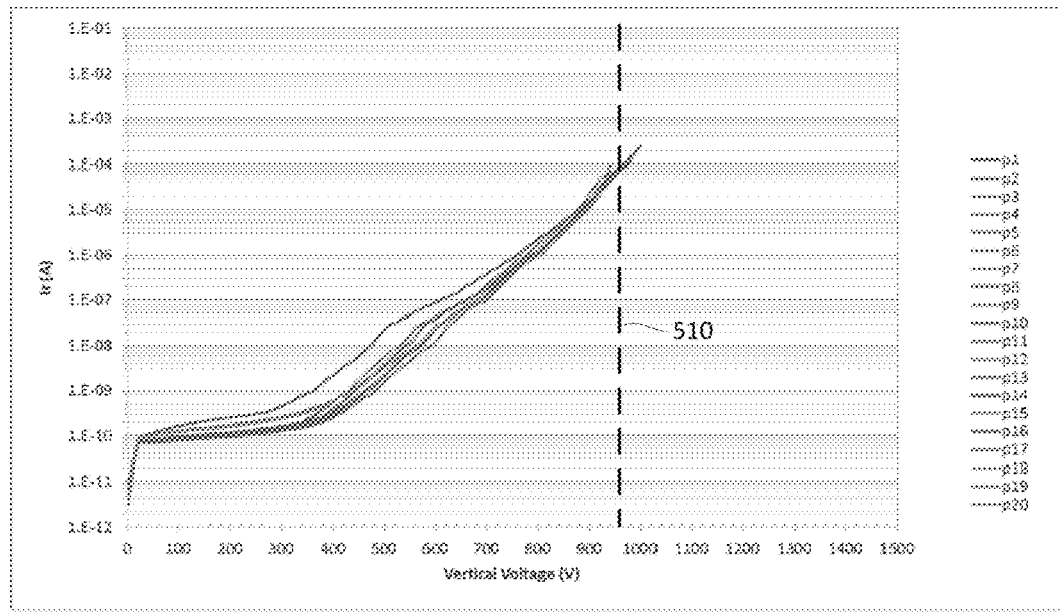
FIG. 5 shows a plot of the vertical breakdown voltage of a plurality of HEMT devices according to the prior art.
Figure 6:
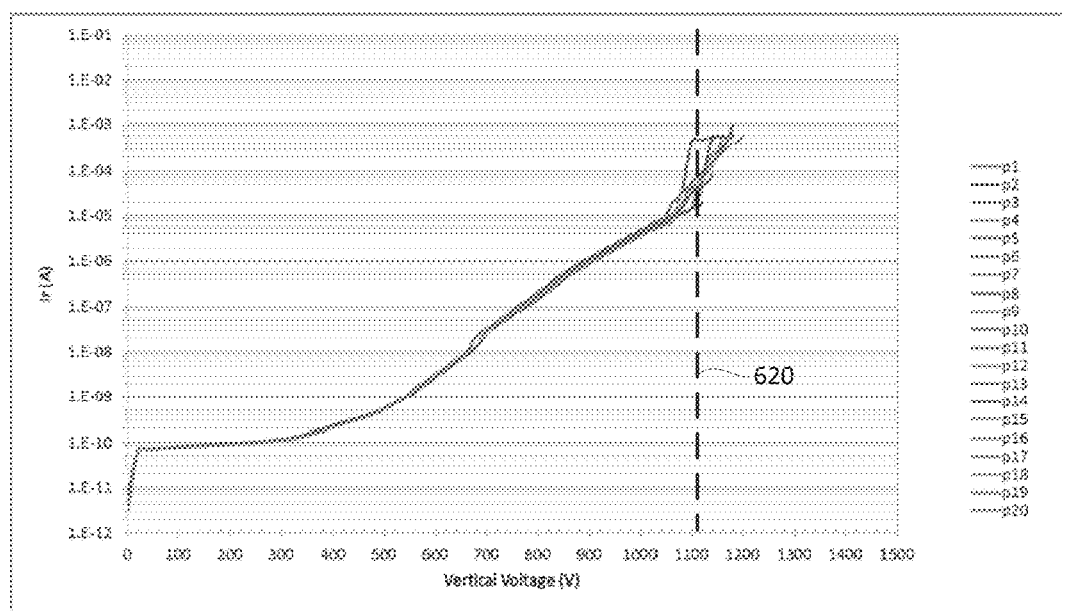
FIG. 6 shows a plot of the vertical breakdown voltage of a plurality of HEMT devices with alternating layers of undoped gallium nitride and carbon doped gallium nitride, according to one embodiment of the invention.

FIG. 5 shows a plot of the vertical breakdown voltage of a plurality of HEMT devices with a single thick layer of carbon doped gallium nitride (c-GaN) according to the prior art, and FIG. 6 shows a plot of the vertical breakdown voltage of a plurality of HEMT devices with alternating layers of undoped gallium nitride (GaN) and carbon doped gallium nitride (c-GaN), according to one embodiment of the invention. In both FIGS. 5 and 6, data points p1-p20 represent different HEMT devices manufactured on a single wafer. As shown in FIG. 5, there is some variation between the current (Ir) and vertical voltage (V) characteristics of the prior art HEMT devices p1-p20, and in general, the prior art HEMT devices p1-p20 exhibit a vertical breakdown voltage 510 of approximately 960V. In contrast, as shown in FIG. 6, there is very little variation between the current (Ir) and vertical voltage (V) characteristics of the plurality of HEMT devices alternating layers of undoped gallium nitride (GaN) and carbon doped gallium nitride (c-GaN) p1-p20. Additionally, the HEMT devices with alternating layers of undoped gallium nitride (GaN) and carbon doped gallium nitride (c-GaN) exhibit a vertical breakdown voltage 620 of approximately 1120V, a 160V improvement over the vertical breakdown voltage 510 of prior art HEMT devices p1-p20 shown in FIG. 5.

The improvements in device consistency and vertical breakdown voltage can be attributed to the improved structural quality of the HEMT device with alternating layers of undoped gallium nitride (GaN) and carbon doped gallium nitride (c-GaN) as compared with the prior art HEMT device with a single thick layer of carbon doped gallium nitride (c-GaN), as previously discussed in FIGS. 2A-B and 3A-H.

Figure 7:
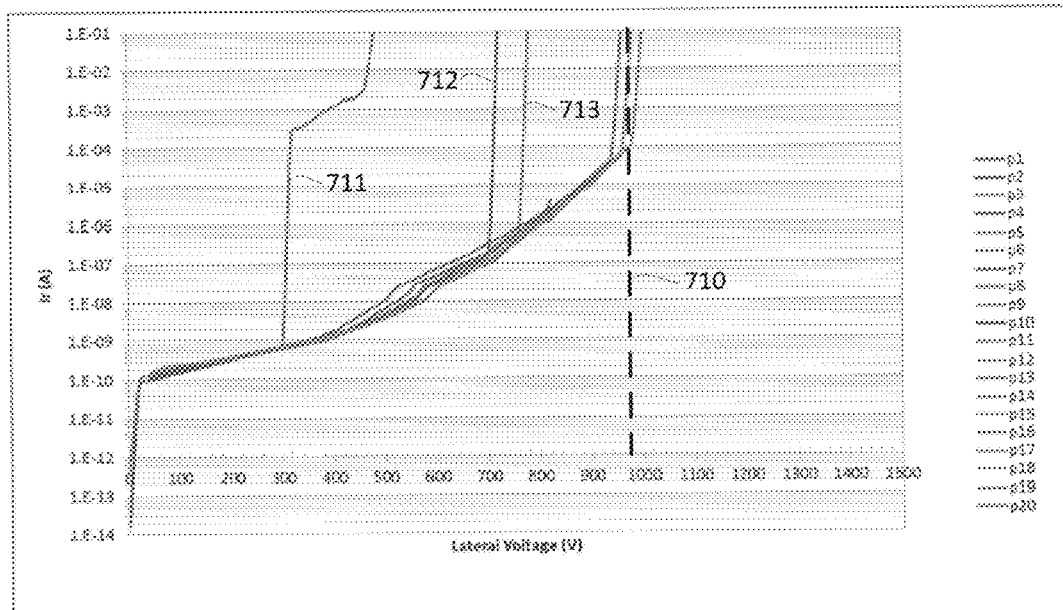
FIG. 7 shows a plot of the lateral breakdown voltage of a plurality of HEMT devices according to the prior art.
Figure 8:
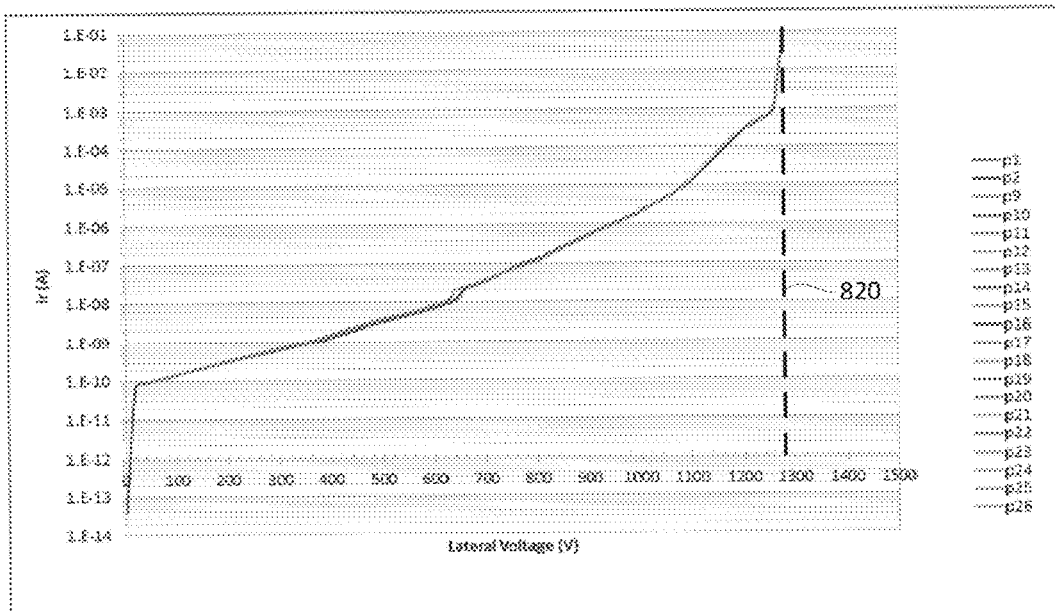
FIG. 8 shows a plot of the lateral breakdown voltage of a plurality of HEMT devices with alternating layers of undoped gallium nitride and carbon-doped gallium nitride, according to one embodiment of the invention.

FIG. 7 shows a plot of the lateral breakdown voltage of a plurality of HEMT devices according to the prior art. FIG. 8 shows a plot of the lateral breakdown voltage of a plurality of HEMT devices with alternating layers of undoped gallium nitride (GaN) and carbon-doped gallium nitride (c-GaN), according to one embodiment of the invention. Again, In both FIGS. 7 and 8, data points p1-p20 represent different HEMT devices manufactured on a single wafer. As shown in FIG. 7, there is substantial variation between the current (Ir) and lateral voltage (V) characteristics of the prior art HEMT devices p1-p20, with multiple prior art HEMT devices exhibiting extremely poor lateral breakdown voltages 711, 712, and 713. At best, the prior art HEMT devices p1-p20 exhibit a lateral breakdown voltage 710 of approximately 980V.

Like the vertical breakdown voltage characteristics shown in FIG. 6, there is nominal variation between the current (Ir) and lateral voltage (V) characteristics of the plurality of HEMT devices alternating layers of undoped gallium nitride (GaN) and carbon doped gallium nitride (c-GaN) p1-p20 shown in FIG. 8. Additionally, the HEMT devices with alternating layers of undoped gallium nitride (GaN) and carbon doped gallium nitride (c-GaN) exhibit a lateral breakdown voltage 820 of approximately 1280V, a 300V improvement over the best lateral breakdown voltage 710 of prior art HEMT devices p1-p20 shown in FIG. 7. Once again, the improvements in device consistency and lateral breakdown voltage can be attributed to the improved structural quality of the HEMT device with alternating layers of undoped gallium nitride (GaN) and carbon doped gallium nitride (c-GaN).

Electrical Testing Data Comparison:

| Device | Channel Layer Thickness (μm) | Vertical Breakdown Voltage (V) | Vertical Leakage Current @ 600 V (A) | Vertical Leakage Current @ 800 V (A) | Lateral Breakdown Voltage (V) | Lateral Leakage Current @ 600 V (A) |
|---|---|---|---|---|---|---|
| HEMT with alternating layers of c-GaN and GaN | 3.0 | 1180 | $8.80E^{-6}$ | $5.00E^{-4}$ | 1160 | $8.44E^{-7}$ |
| HEMT with single thick layer of c-GaN | 3.0 | 960 | $8.12E^{-5}$ | $3.42E^{-3}$ | 940 | $5.63E^{-7}$ |

The above electrical testing data chart shows a direct comparison between the electrical characteristics of an HEMT device with alternating layers of carbon doped gallium nitride (c-GaN) and undoped gallium nitride (GaN), according to one embodiment of the invention, and a prior art HEMT device with a single thick layer of carbon doped gallium nitride (c-GaN). The total thickness of the alternating layers of carbon doped gallium nitride (c-GaN) and undoped gallium nitride (GaN) of the HEMT device according to one embodiment of the invention is 3.0 μm, and the total thickness of the single thick layer of carbon doped gallium nitride (c-GaN) of the prior art HEMT device is also 3.0 μm.

While the thickness of the channel layer of both devices are similar, the HEMT device with alternating layers of carbon doped gallium nitride (c-GaN) and undoped gallium nitride (GaN) exhibits superior vertical and lateral breakdown voltages while simultaneously realizing reduced vertical leakage currents at operating voltages of 600V and 800V compared with the prior art HEMT device. While the lateral leakage current of the HEMT device with alternating layers of carbon doped gallium nitride (c-GaN) and undoped gallium nitride (GaN) is slightly more than the prior art HEMT device, the improvement in vertical and lateral breakdown voltage and vertical leakage current greatly outweigh the slight increase in lateral leakage current.

While the above detailed description describes and illustrates the embodiments of the present invention with respect to a type of HEMT device, the disclosed techniques can be applied to different types of transistor devices, including, for example, depletion mode (D-Mode) HEMT devices, enhancement mode (E-Mode) HEMT devices, and J-FET devices.

Other objects, advantages and embodiments of the various aspects of the present invention will be apparent to those who are skilled in the field of the invention and are within the scope of the description and the accompanying Figures. For example, but without limitation, structural elements might be rearranged, or method steps reordered, consistent with the present invention. Similarly, principles according to the present invention, and methods and systems that embody them, could be applied to other examples, which, even if not specifically described here in detail, would nevertheless be within the scope of the present invention.

What is claimed is:

1. A method of forming a high electron mobility transistor device, the method comprising:
   providing a substrate;
   forming a channel layer stack on the substrate having at least four alternating layers of gallium nitride layers and carbon doped gallium nitride layers; and
   forming a barrier layer on the channel layer stack,
   wherein the high electron mobility transistor device has a lateral breakdown voltage between 1000V and 1280V or a vertical breakdown voltage between 1000V and 1180V.

2. The method according to claim 1, wherein forming the channel layer stack comprises
   growing each of the gallium nitride layers in first growth conditions such that carbon incorporation in the gallium nitride is suppressed, and
   growing each of the carbon doped gallium nitride layers in second growth conditions such that carbon incorporation in the gallium nitride is promoted.

3. The method according to claim 1, wherein forming the channel layer stack comprises
   forming each of the gallium nitride layers with a carbon concentration less than $1E^{18}$ Atoms/cm$^3$; and
   forming each of the carbon doped gallium nitride layers having a carbon concentration of greater than $1E^{18}$ Atoms/cm$^3$.

4. The method according to claim 2, wherein
   growing each of the gallium nitride layers comprises providing the first growth conditions comprise a low growth rate and a high ratio of group-V precursors to group-III precursors, and
   growing each of the carbon doped gallium nitride layers comprises providing a high growth rate and a low ratio of group-V precursors to group-III precursors.

5. The method according to claim 4, wherein
   the low growth rate for growing each of the gallium nitride layers is greater than 0.1 μm/hr and less than 5 μm/hr, and
   the high growth rate for growing each of the carbon doped gallium nitride layers is greater than 5 μm/hr and less than 10 μm/hr.

6. The method according to claim 5, wherein the high growth rate for growing each of the carbon doped gallium nitride layers is about 15 to 20 times greater than the low growth rate for growing each of the gallium nitride layers.

7. The method according to claim 4, wherein the high ratio for growing each of the gallium nitride layers is greater than 100:1 and less than 10000:1, and the low ratio for growing each of the carbon doped gallium nitride layers is greater than 10:1 and less than 200:1.

8. The method according to claim 4, wherein the first and second growth conditions for growing each of the gallium nitride layers and each of the carbon doped gallium nitride layers further comprise a growth temperature and a growth pressure.

9. The method according to claim 8, wherein the growth temperature for growing each of the gallium nitride layers and each of the carbon doped gallium nitride layers is greater than 750 C and less than 1000 C, and
wherein the growth pressure for growing each of the gallium nitride layers and each of the carbon doped gallium nitride layers is greater than 35 Torr and less than 700 Torr.

10. The method according to claim 1, wherein forming the channel layer stack comprises
growing each of the gallium nitride layers to a thickness greater than 1nm and less than 200 nm, and
growing each of the carbon doped gallium nitride layers to a thickness greater than 1nm and less than 500 nm.

11. The method according to claim 1, wherein forming the channel layer stack comprises growing each one of the gallium nitride layers and each one of the carbon doped gallium nitride layers such that the ratio of the thickness of each of the carbon doped gallium nitride layers to the thickness of each of the gallium nitride layers is greater than 1:3 and less than 3:1.

12. The method according to claim 1, further comprising:
forming a source electrode electrically coupled to the barrier layer;
forming a drain electrode electrically coupled to the barrier layer; and
forming a gate electrode electrically coupled to the barrier layer between the source and drain electrodes,
wherein the source and drain electrodes form an ohmic connection with the barrier layer, and the gate electrode forms a non-ohmic connection with the barrier layer.

13. The method according to claim 1, wherein the barrier layer comprises aluminum gallium nitride.

14. The method according to claim 1, further comprising:
forming a buffer layer between the substrate and the channel layer stack.

15. A high electron mobility transistor device comprising:
a substrate;
a channel layer stack on the substrate having at least four alternating layers of gallium nitride layers and carbon doped gallium nitride layers; and
a barrier layer on the channel layer stack,
wherein the high electron mobility transistor device has a lateral breakdown voltage between 1000V and 1280V or a vertical breakdown voltage between 1000V and 1180V.

16. The high electron mobility transistor device of claim 15, wherein each of the gallium nitride layers have a carbon concentration less than $1E^{18}$ Atoms/cm$^3$ and each of carbon doped gallium nitride layers have a carbon concentration of greater than $1E^{18}$ Atoms/cm$^3$.

17. The high electron mobility transistor device of claim 15, wherein each of the gallium nitride layers have a thickness greater than 1nm and less than 200 nm, and each of the carbon doped gallium nitride layers have a thickness greater than 1nm and less than 500 nm.

18. The high electron mobility transistor device of claim 15, wherein the ratio of the thickness of each of the carbon doped gallium nitride layers to the thickness of each of the gallium nitride layers is greater than 1:3 and less than 3:1.

19. The high electron mobility transistor device of claim 15, further comprising:
a source electrode electrically coupled to the barrier layer;
a drain electrode electrically coupled to the barrier layer; and
a gate electrode electrically coupled to the barrier layer between the source and drain electrodes,
wherein the source and drain electrodes form an ohmic connection with the barrier layer, and the gate electrode forms a non-ohmic connection with the barrier layer.

20. The high electron mobility transistor device according to claim 15, wherein the barrier layer comprises aluminum gallium nitride.

21. The high electron mobility transistor device according to claim 15, further comprising:
a buffer layer between the substrate and the channel layer stack.

22. The method of claim 1, wherein an uppermost layer of the channel layer stack is a gallium nitride layer.

23. The method of claim 1, wherein a lowermost layer of the channel layer stack is a gallium nitride layer.

24. The method of claim 1, wherein both an uppermost layer and a lowermost layer of the channel layer stack are gallium nitride layers.

25. The high electron mobility transistor device of claim 15, wherein an uppermost layer of the channel layer stack is a gallium nitride layer.

26. The high electron mobility transistor device of claim 15, wherein a lowermost layer of the channel layer stack is a gallium nitride layer.

27. The high electron mobility transistor device of claim 15, wherein both an uppermost layer and a lowermost layer of the channel layer stack are gallium nitride layers.

28. The method of claim 1, wherein the high electron mobility transistor device has a lateral breakdown voltage between 1000V and 1280V and a vertical breakdown voltage between 1000V and 1180V.

29. The high electron mobility transistor device of claim 15, wherein the high electron mobility transistor device has a lateral breakdown voltage between 1000V and 1280V and a vertical breakdown voltage between 1000V and 1180V.

* * * * *